United States Patent
Lai et al.

(10) Patent No.: US 8,305,749 B2
(45) Date of Patent: Nov. 6, 2012

(54) DETACHABLE CLIP MECHANISM AND RELATED COMPUTER SYSTEM

(75) Inventors: Kun-Hui Lai, Taipei Hsien (TW); Cheng-Hsiang Chuang, Taipei Hsien (TW); Chien-Ping Kuo, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 190 days.

(21) Appl. No.: 12/880,158

(22) Filed: Sep. 13, 2010

(65) Prior Publication Data

US 2011/0194236 A1 Aug. 11, 2011

(30) Foreign Application Priority Data

Feb. 5, 2010 (TW) .............................. 99202403 U

(51) Int. Cl.
*H05K 5/00* (2006.01)
*H05K 7/00* (2006.01)
(52) U.S. Cl. .............................. 361/679.33; 361/679.37
(58) Field of Classification Search ............. 361/679.33, 361/679.37
See application file for complete search history.

(56) References Cited

U.S. PATENT DOCUMENTS

| | | | | |
|---|---|---|---|---|
| 6,982,870 B2* | 1/2006 | Wu et al. | ................... | 361/679.33 |
| 7,155,730 B2* | 12/2006 | Hsu et al. | ....................... | 720/600 |
| 7,408,771 B2* | 8/2008 | Chen et al. | ................ | 361/679.33 |
| 7,495,904 B2* | 2/2009 | Liang et al. | .............. | 361/679.39 |
| 7,679,896 B2* | 3/2010 | Deng et al. | ............... | 361/679.33 |
| 7,817,413 B2* | 10/2010 | Peng et al. | ............... | 361/679.33 |
| 2005/0235295 A1* | 10/2005 | Hsu et al. | ...................... | 720/600 |
| 2008/0089021 A1* | 4/2008 | Deng et al. | .................... | 361/685 |

* cited by examiner

*Primary Examiner* — Anthony Haughton
(74) *Attorney, Agent, or Firm* — Winston Hsu; Scott Margo

(57) ABSTRACT

A clip mechanism includes a first lateral wall whereon a slot is formed, and a second lateral wall disposed on a side of the first lateral wall. At least one opening is formed on the second lateral wall for engaging with a protrusion of a casing. The clip mechanism further includes a bending part bent for connecting the first lateral wall and the second lateral wall. The clip mechanism further includes a resilient arm. A first end of the resilient arm is connected to an end of the slot of the first lateral wall, and a second end of the resilient arm protrudes out of a side of the slot. The resilient arm further includes a contacting part protruding out of the other side of the slot for contacting against an electronic device so as to ground the electronic device.

8 Claims, 4 Drawing Sheets

DETACHABLE CLIP MECHANISM AND RELATED COMPUTER SYSTEM

BACKGROUND OF THE INVENTION

1. Field of the Invention

The present invention relates to a clip mechanism and a related computer system, and more specifically, to a detachable clip mechanism and a related computer system.

2. Description of the Prior Art

In some countries with the dry climate, electrostatic discharge protection is an issue in an electronic device. For example, when a user carries a notebook in a dry environment, static electricity is usually conducted from the user's hand to internal electronic components of the notebook computer so that the internal electronic components of the notebook might be damaged by electrostatic discharge if there is no electrostatic discharge protection. Conductive gaskets are attached around electronic components in the prior art to improve electrostatic discharge protection. However, it increases assembly time, assembly tolerance and manufacture cost, and it may cause short circuit of a main board and burning of components due to separation of the conductive gaskets. Besides conventional assembly of attaching conductive gaskets, assembly of hot melting is also utilized to fix clips around electronic components, but it has disadvantages of being not detachable, increasing cost due to equipments of hot melting, getting higher defective rate, and incapability of rework. Furthermore, clips installed on a right side and on a left side of a casing of a notebook in the prior art can not be the identical components due to constraint on assembly direction. It is an important issue to design a simple structure and a grounding mechanism for providing good grounding function and electrostatic discharge protection.

SUMMARY OF THE INVENTION

The present invention provides a detachable clip mechanism and a related computer system to solve the problems mentioned above.

According to the claimed invention, a clip mechanism includes a first lateral wall whereon a slot is formed, and a second lateral wall disposed on a side of the first lateral wall. At least one opening is formed on the second lateral wall for engaging with a protrusion of a casing. The clip mechanism further includes a bending part bent for connecting the first lateral wall and the second lateral wall. The clip mechanism further includes a resilient arm. A first end of the resilient arm is connected to an end of the slot of the first lateral wall, and a second end of the resilient arm protrudes out of a side of the slot. The resilient arm further includes a contacting part protruding out of the other side of the slot for contacting against an electronic device.

According to the claimed invention, a blocking wall is formed on the second lateral wall for blocking the second end of the resilient arm.

According to the claimed invention, the second lateral wall includes at least one resilient hook. The resilient hook includes a curved part connected to the bending part, and a locking part connected to the curved part. The locking part is for locking the casing when the opening engages with the protrusion of the casing. The locking part is driven to depart from the casing when the bending part is pressed downward.

According to the claimed invention, the clip mechanism is made of metal material.

According to the claimed invention, a computer system includes a casing whereon at least one protrusion is formed; an electronic device detachably installed inside the casing; and a clip mechanism detachably installed on the casing for grounding the electronic device to the casing. The clip mechanism includes a first lateral wall whereon a slot is formed, and a second lateral wall disposed on a side of the first lateral wall. At least one opening is formed on the second lateral wall for engaging with a protrusion of a casing. The clip mechanism further includes a bending part bent for connecting the first lateral wall and the second lateral wall. The clip mechanism further includes a resilient arm. A first end of the resilient arm is connected to an end of the slot of the first lateral wall, and a second end of the resilient arm protrudes out of a side of the slot. The resilient arm further includes a contacting part protruding out of the other side of the slot for contacting against an electronic device.

According to the claimed invention, a side of the casing contacting the clip mechanism is electroplated or sputtered with conducting material.

According to the claimed invention, the protrusion includes an inclined structure for guiding the second lateral wall to slide relative to the casing.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
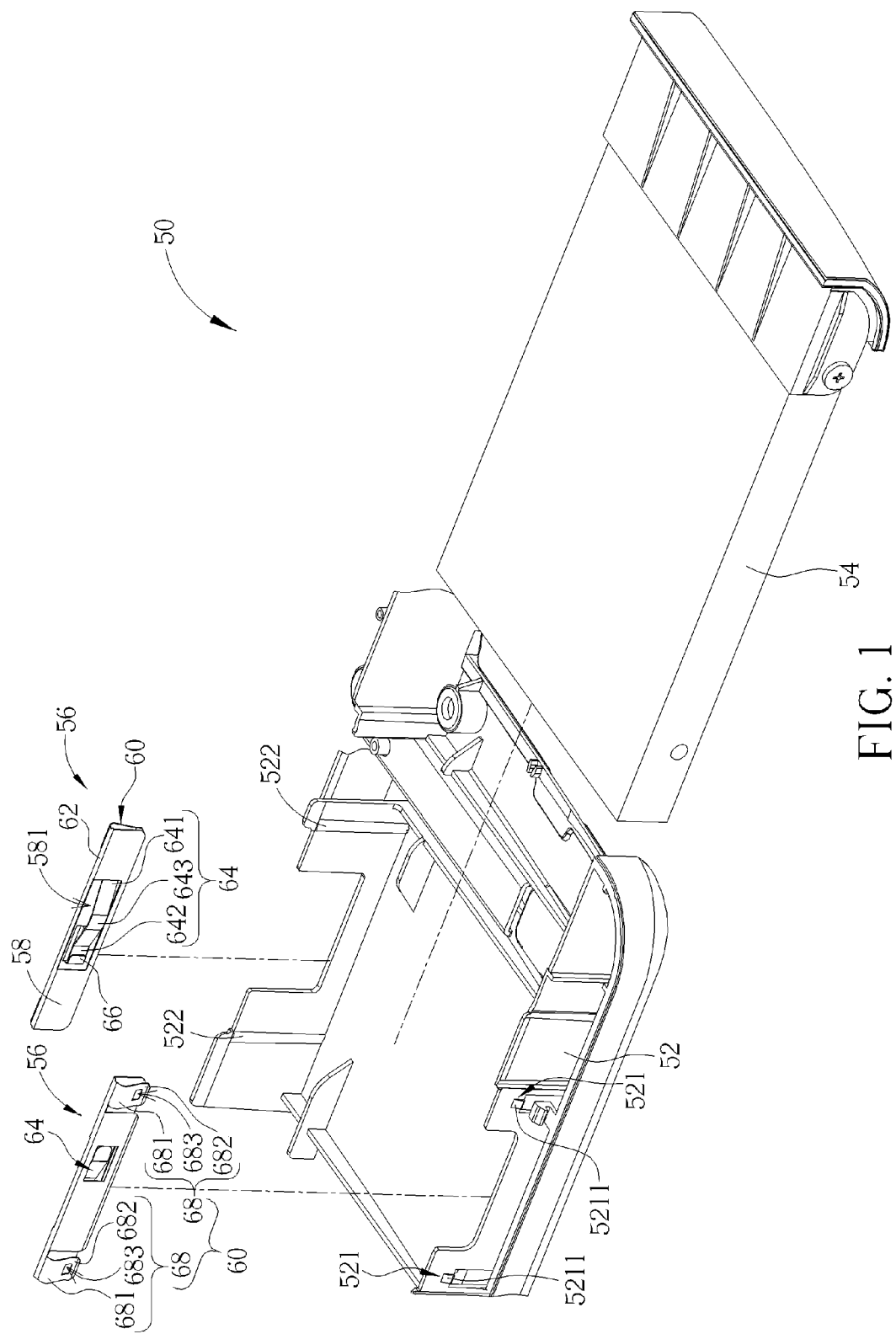
FIG. 1 is an exploded diagram of a computer system according to a preferred embodiment of the present invention.
Figure 2:
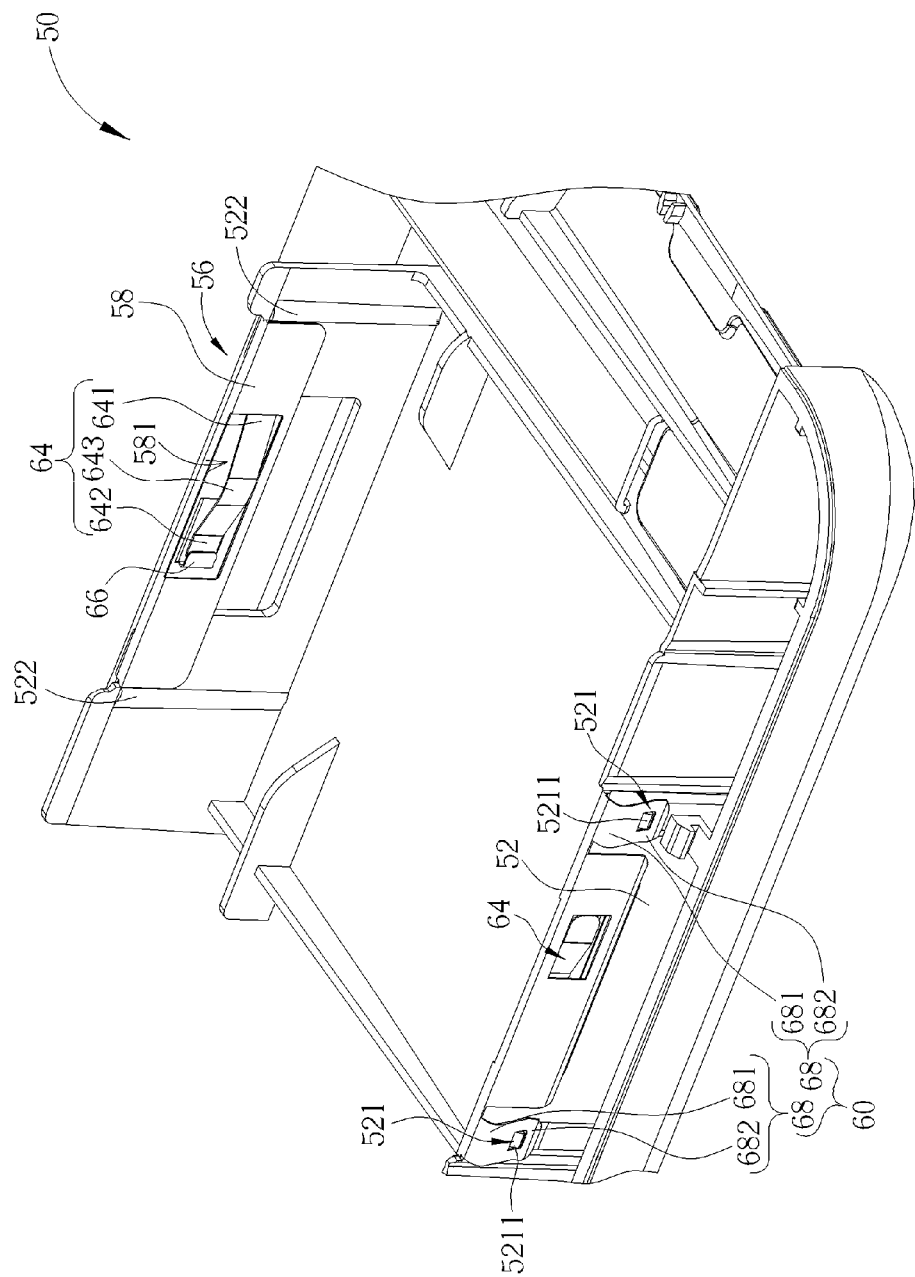
FIG. 2 is an assembly diagram of the computer system according to the preferred embodiment of the present invention.

Please refer to FIG. 1 and FIG. 2. FIG. 1 is an exploded diagram of a computer system 50 according to a preferred embodiment of the present invention. FIG. 2 is an assembly diagram of the computer system 50 according to the preferred embodiment of the present invention. The computer system 50 can be a desktop computer or a portable computer, such as a notebook computer and so on. The computer system 50 includes a casing 52 for containing internal components. The casing 52 can be made of plastic material or metal material. At least one protrusion 521 is formed on the casing 52. In this embodiment, two protrusions 521 are respectively disposed on two sides of the casing 52. Positions and numbers of the protrusions 521 are not limited to the embodiment and depend on design demands. Furthermore, each protrusion 521 includes an inclined structure 5211. The computer system 50 further includes an electronic device 54. The electronic device 54 can be a storage device, such as a hard disk, a CD player, and so on. The electronic device 54 is detachably installed inside the casing 52. The computer system 50 further includes a clip mechanism 56 detachably installed on the casing 52 for grounding the electronic device 54 so as to provide the electronic device 54 with electrostatic discharge protection. The clip mechanism 56 can be made of metal material, such as tinplate, stainless steel and so on.

Figure 3:
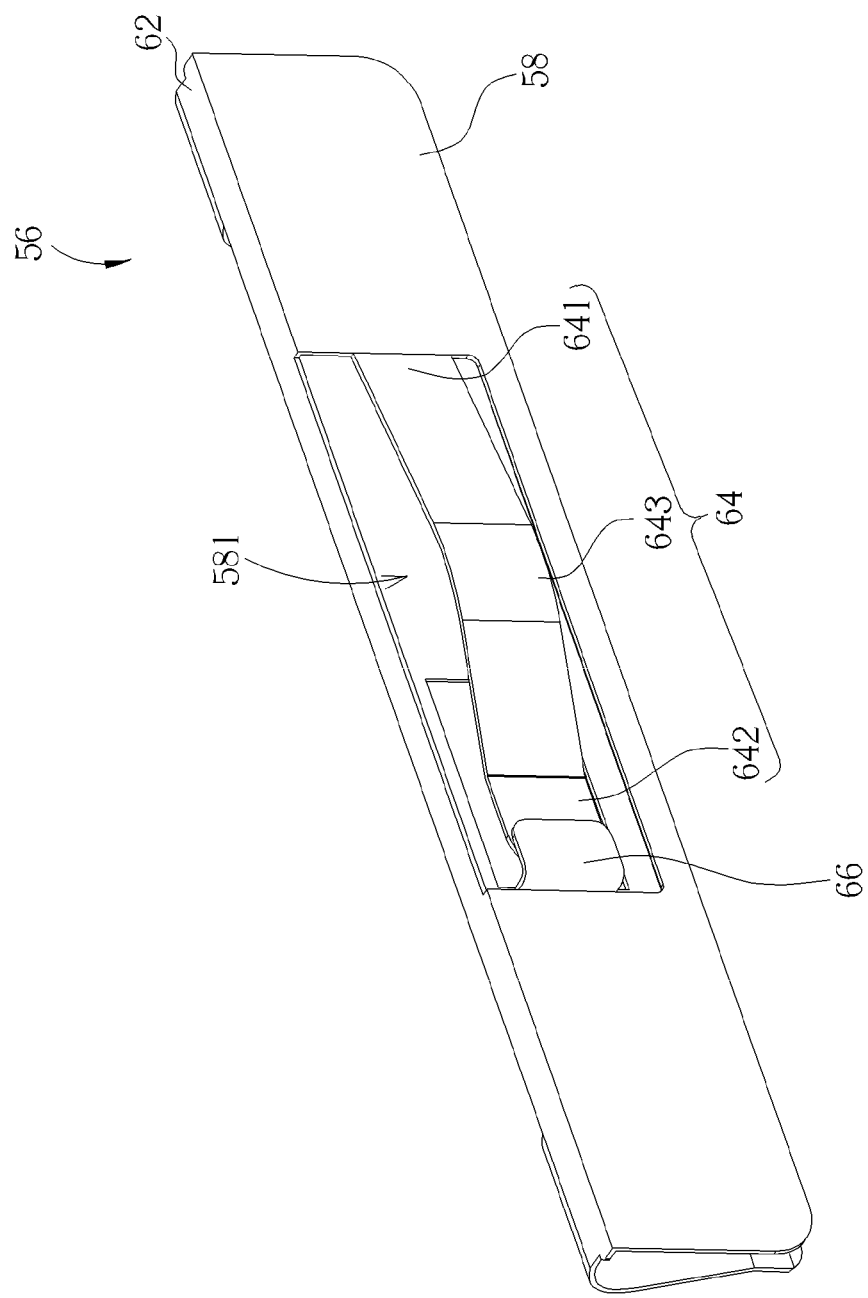
FIG.3 and FIG.4 are drawings of a clip mechanism at different views according to the preferred embodiment of the present invention.
Figure 4:
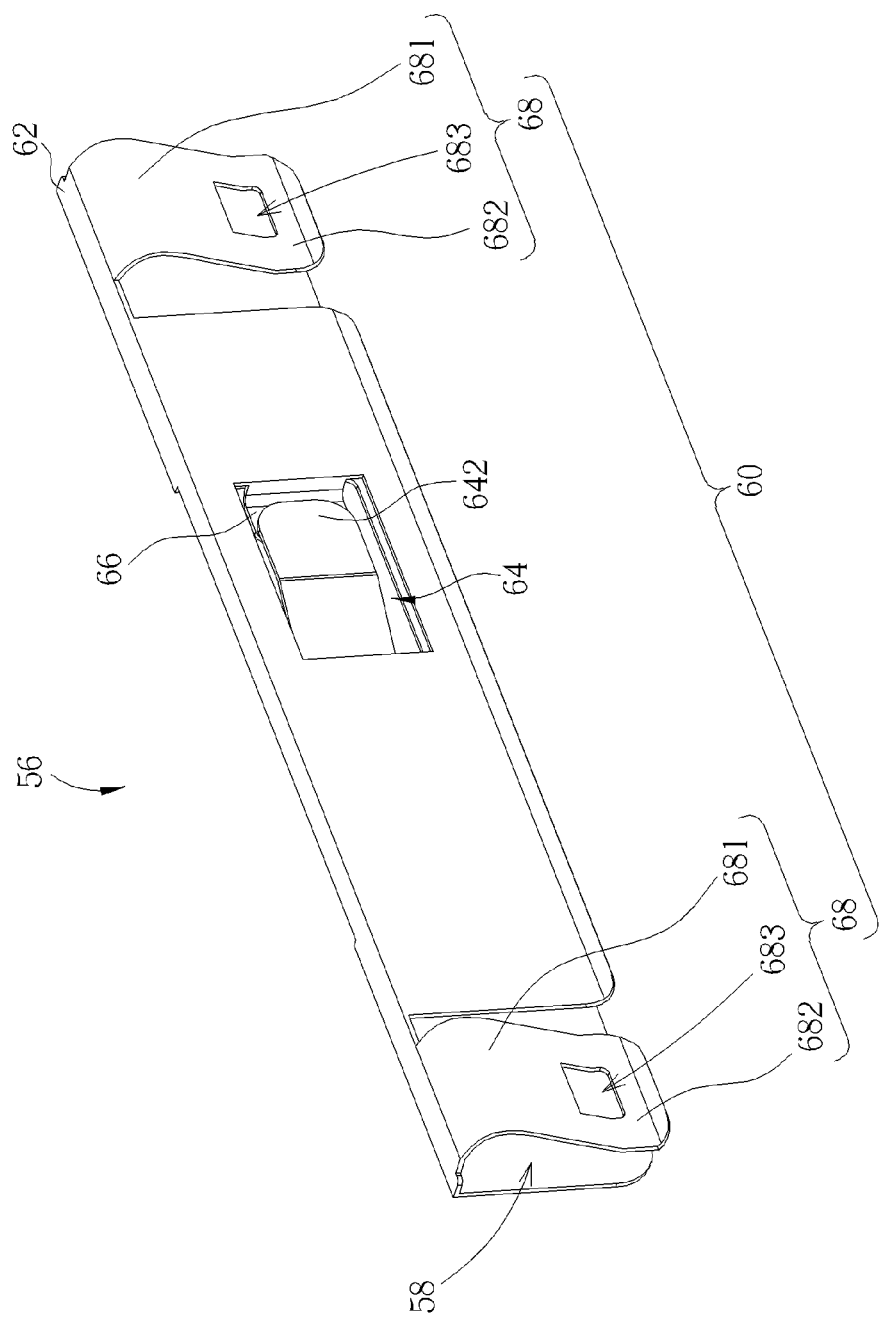

Please refer to FIG. 1 to FIG. 4. FIG. 3 and FIG. 4 are drawings of the clip mechanism 56 at different views according to the preferred embodiment of the present invention. The clip mechanism 56 includes a first lateral wall 58, and a slot 581 is formed on the first lateral wall 58. The clip mechanism 56 further includes a second lateral wall 60 disposed on a side of the first lateral wall 58. The clip mechanism 56 further includes a bending part 62 bent for connecting the first lateral wall 58 and the second lateral wall 60. The first lateral wall 58, the second lateral wall 60, and the bending part 62 can be integrated monolithically. A gap is formed between the first lateral wall 58, the second lateral wall 60, and the bending part 62 for clipping the casing 52 so that the clip mechanism 56 is detachably connected to the casing 52. The clip mechanism 56 further includes a resilient arm 64. A first end 641 of the resilient arm 64 is connected to an end of the slot 581 of the first lateral wall 58, and a second end 642 of the resilient arm 64 protrudes out of a side of the slot 581. The resilient arm 64 further includes a contacting part 643 protruding out of the other side of the slot 581 for contacting against the electronic device 54 so as to ground the electronic device 54. Since the casing 52 can be a plastic casing, a side of the casing 52 contacting the clip mechanism 56 can be electroplated or sputtered with conducting material. If the casing 52 is conductive, such as an aluminum-magnesium casing, the side of the casing 52 contacting the clip mechanism 56 is not required to be electroplated or sputtered with conducting material. Since the clip mechanism 56 can be made of conductive material (such as metal material), the contacting part 643 contacts against a side of the electronic device 54 so that the clip mechanism 56 is electrically connected to the casing 52 for grounding the electronic device 54, so as to improve electrostatic discharge protection.

Besides, a blocking wall 66 is formed on the second lateral wall 60 for blocking the second end 642 of the resilient arm 64. The blocking wall 66 can be formed by stamping and bending a part of the second lateral wall 60. The second end 642 of the resilient arm 64 protrudes out of the side of the slot 581, and the blocking wall 66 can block the second end 642 of the resilient arm 64, so as to prevent the resilient arm 64 from stretching to the other side of the slot 581 excessively, such that it prevents interference between the resilient arm 64 and the side of the electronic device 54 when the electronic device 54 is inserted into the computer system 50. Furthermore, the second lateral wall 60 preferably includes at least one resilient hook 68 for clipping the casing 52 firmly. In this embodiment, the second lateral wall 60 includes two resilient hooks 68. Each resilient hook 68 includes a curved part 681 connected to the bending part 62. Each resilient hook 68 further includes a locking part 682 connected to the curved part 681. One opening 683 is formed on each resilient hook 68 for engaging with the protrusion 521 of the casing 52. Since curved structure of the curved part 681 can provide the locking part 682 with elastic force, the locking part 682 can firmly lock the casing 52 when the opening 683 engages with the protrusion 521 of the casing 52.

As shown in FIG. 1 and FIG. 2, when the clip mechanism 56 is assembled downward to the casing 52, a corresponding guiding structure 522 (such as a rib) can be disposed on the casing 52 beside the resilient hook 68 for guiding the first lateral wall 58 to move smoothly along the guiding structure 522 with a predetermined routine. First, the lateral wall structure of the casing 52 can enlarge a gap between the first lateral wall 58 and the resilient hook 68, such that the lateral wall structure can be inserted into the gap between the first lateral wall 58 and the resilient hook 68. Then, the locking part 682 of the resilient hook 68 moves along the inclined structure 5211 of the protrusion 521, and the gap between the first lateral wall 58 and the resilient hook 68 becomes larger, i.e. the inclined structure 5211 can guide movement of the resilient hook 68 relative to the casing 52. At last, the opening 683 can engage with the protrusion 521 when the opening 683 of the resilient hook 68 moves to position of the protrusion 521. Since the protrusion 521 can not push the locking part 682, elastic force of the curved part 681 can drive the locking part 682 to fix on the casing 52 firmly. On the other hand, when a user wants to depart the clip mechanism 56 from the casing 52, the user can press the curved part 681 downward so as to make the locking part 682 warp outward by leverage principle, such that the locking part 682 is driven to depart from the casing 52. The opening 683 can depart from the protrusion 521 simultaneously. Afterward, it is easy to remove the clip mechanism 56.

In contrast to the prior art, the clip mechanism of the present invention is detachable, so it has advantages of substitute for hot melting means, i.e. it does not require equipments of hot melting, and it does not waste time of hot melting, so as to reduce assembly time and to economize cost. Besides, it can solve the problems of increasing assembly time, manufacture cost, and assembly tolerance by attaching conductive gaskets, and it can further avoid short circuit of a main board and burning of components due to separation of the conductive gaskets. Furthermore, the clip mechanism of the present invention does not utilize conductive glue for saving the manufacture cost. It is fast to install the clip mechanism without hot melting and without deviation of attachment. Since the clip mechanisms of the present invention can be installed on two sides of the electronic device and fix the electronic device simultaneously, i.e. the clip mechanisms of the present invention installed on a right side and on a left side of the casing can be the identical components, so it is convenient to manage material, it reduces mold cost, and it is easy to control tolerance. Furthermore, the clip mechanism of the present invention is detachable and reusable, so it can be designed with respect to standard size of hard disks or CD players so as to solve incapability of reuse assembly of hot melting and attachment.

Those skilled in the art will readily observe that numerous modifications and alterations of the device and method may be made while retaining the teachings of the invention.

What is claimed is:

1. A clip mechanism comprising:
   a first lateral wall whereon a slot is formed;
   a second lateral wall disposed on a side of the first lateral wall, at least one opening being formed on the second lateral wall for engaging with a protrusion of a casing;
   a bending part bent for connecting the first lateral wall and the second lateral wall, a gap being formed between the first lateral wall, the second lateral wall, and the bending part for clipping the casing;
   a resilient arm, a first end of the resilient arm being connected to an end of the slot of the first lateral wall, a second end of the resilient arm protruding out of a side of the slot, and the resilient arm further comprising a contacting part protruding out of the other side of the slot for contacting against an electronic device so as to ground the electronic device; and
   a blocking wall formed on the second lateral wall for blocking the second end of the resilient arm to prevent the resilient arm from stretching to the other side of the slot, so as to prevent interference between the resilient arm and a side of the electronic device when the electronic device is inserted into the casing.

2. The clip mechanism of claim 1, wherein the second lateral wall comprises at least one resilient hook, the resilient hook comprising:
   a curved part connected to the bending part; and a locking part connected to the curved part, the locking part being for locking the casing when the opening engages with the protrusion of the casing, wherein the locking part is driven to depart from the casing when the bending part is pressed downward.

3. The clip mechanism of claim 1, wherein the clip mechanism is made of metal material.

4. A computer system comprising:
a casing whereon at least one protrusion is formed;
an electronic device detachably installed inside the casing; and
a clip mechanism detachably installed on the casing for grounding the electronic device to the casing, the clip mechanism comprising:
  a first lateral wall whereon a slot is formed;
  a second lateral wall disposed on a side of the first lateral wall, at least one opening being formed on the second lateral wall for engaging with the protrusion of the casing;
  a bending part bent for connecting the first lateral wall and the second lateral wall, a gap being formed between the first lateral wall, the second lateral wall, and the bending part for clipping the casing;
  a resilient arm, a first end of the resilient arm being connected to an end of the slot of the first lateral wall, a second end of the resilient arm protruding out of a side of the slot, and the resilient arm further comprising a contacting part protruding out of the other side of the slot for contacting against the electronic device; and
  a blocking wall formed on the second lateral wall for blocking the second end of the resilient arm to prevent the resilient arm from stretching to the other side of the slot, so as to prevent interference between the resilient arm and a side of the electronic device when the electronic device is inserted into the casing.

5. The computer system of claim 4, wherein a side of the casing contacting the clip mechanism is electroplated or sputtered with conducting material.

6. The computer system of claim 4, wherein the protrusion comprises an inclined structure for guiding the second lateral wall to slide relative to the casing.

7. The computer system of claim 4, wherein the second lateral wall
comprises at least one resilient hook, the resilient hook comprising:
a curved part connected to the bending part; and
a locking part connected to the curved part, the locking part being for locking the casing when the opening engages with the protrusion of the casing, wherein the locking part is driven to depart from the casing when the bending part is pressed downward.

8. The computer system of claim 4, wherein at least one guiding structure is disposed on the casing for guiding movement of the first lateral wall.

* * * * *